(12) United States Patent
Mori et al.

(10) Patent No.: US 11,298,928 B2
(45) Date of Patent: Apr. 12, 2022

(54) PROTECTIVE SHEET DISPOSING METHOD

(71) Applicant: DISCO CORPORATION, Tokyo (JP)

(72) Inventors: Takashi Mori, Tokyo (JP); Yoshikuni Migiyama, Tokyo (JP); Yuta Taniyama, Tokyo (JP); Mitsuru Ikushima, Tokyo (JP); Shinichi Namioka, Tokyo (JP); Makoto Saito, Tokyo (JP); Emiko Kawamura, Tokyo (JP); Yoshinori Kakinuma, Tokyo (JP); Kazuki Sugiura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 189 days.

(21) Appl. No.: 16/375,041

(22) Filed: Apr. 4, 2019

(65) Prior Publication Data

US 2019/0308399 A1 Oct. 10, 2019

(30) Foreign Application Priority Data

Apr. 9, 2018 (JP) .............................. JP2018-074505

(51) Int. Cl.
*B32B 37/02* (2006.01)
*H01L 23/00* (2006.01)
(Continued)

(52) U.S. Cl.
CPC .......... *B32B 37/02* (2013.01); *B32B 37/1292* (2013.01); *B32B 38/0004* (2013.01);
(Continued)

(58) Field of Classification Search
CPC . B32B 37/02; B32B 37/1292; B32B 38/0004; B32B 2457/14; B32B 37/12;
(Continued)

(56) References Cited

U.S. PATENT DOCUMENTS

2001/0023691 A1* 9/2001 Sekiya .................. B28D 5/007
125/13.01
2015/0198899 A1* 7/2015 Fukushi .............. G03F 7/70775
355/73

FOREIGN PATENT DOCUMENTS

JP   H0224848 A   *  1/1990
JP   10050642 A      2/1998
(Continued)

OTHER PUBLICATIONS

JP5320058B2—Machine translation of description (EPO/Google) (Year: 2020).*
(Continued)

*Primary Examiner* — Cynthia L Schaller
(74) *Attorney, Agent, or Firm* — Greer Burns & Crain, Ltd.

(57) ABSTRACT

A protective sheet disposing method of disposing a protective sheet on a top surface of a wafer in which a device region having a plurality of devices formed thereon and a peripheral surplus region surrounding the device region are formed, the protective sheet disposing method including: a first protective sheet preparing step of preparing a first protective sheet having a non-adhesive portion corresponding to the device region and an adhesive portion having an adhesive layer laid on a periphery of the non-adhesive portion; a protective sheet affixing step of affixing the first protective sheet to the peripheral surplus region; a liquid resin dropping step of dropping a liquid resin onto a region of a second protective sheet; an integrating step of integrating the first protective sheet and the second protective sheet with each other; and a cutting step of cutting the first protective sheet and the second protective sheet.

10 Claims, 10 Drawing Sheets

(51) Int. Cl.
*B32B 37/12* (2006.01)
*C09J 5/00* (2006.01)
*B32B 38/00* (2006.01)

(52) U.S. Cl.
CPC ............. *C09J 5/00* (2013.01); *H01L 23/562* (2013.01); *B32B 2457/14* (2013.01); *C09J 2203/326* (2013.01)

(58) Field of Classification Search
CPC ................ H01L 23/562; H01L 21/304; H01L 21/67092; H01L 21/6715; H01L 21/67132; H01L 2221/68327; H01L 2221/68318; H01L 2221/6834; H01L 21/6836; H01L 2221/68386; C09J 5/00; C09J 2203/326
See application file for complete search history.

(56) References Cited

FOREIGN PATENT DOCUMENTS

JP          5320058 B2  * 10/2013
WO    WO2017036512 A1  * 3/2017

OTHER PUBLICATIONS

Kurimura et al., "Development of a Next-Generation Temporary Fixing Agent for Electronic Materials," Polymer Journal (2016) 48, 565-570 (published online Jan. 6, 2016). (Year: 2016).*
JPH0224848A Machine Translation of Description (EPO/Google) published Jan. 26, 1990. (Year: 2021).*

* cited by examiner

PROTECTIVE SHEET DISPOSING METHOD

BACKGROUND OF THE INVENTION

Field of the Invention

The present invention relates to a protective sheet disposing method of disposing a protective sheet on a top surface of a wafer in which a device region having a plurality of devices formed therein and a peripheral surplus region surrounding the device region are formed.

Description of the Related Art

A grinding apparatus grinds the undersurface of a wafer having a plurality of devices such as integrated circuits (ICs), large-scale integrations (LSIs), or the like demarcated by planned dividing lines and formed on a top surface of the wafer. The wafer is thereby formed to a predetermined thickness. A dicing apparatus, a laser processing apparatus, or the like thereafter divides the wafer into the individual devices. Each of the divided devices is used in an electric apparatus such as a mobile phone, a personal computer, or the like.

The grinding apparatus is generally constituted of a chuck table that sucks and holds the wafer, grinding means that rotatably supports a grinding wheel for grinding the wafer held on the chuck table, and feeding means grinding-feeding the grinding means. The grinding apparatus can finish the wafer to a desired thickness (see Japanese Patent No. 3556399, for example).

In addition, in a case of grinding the undersurface of a wafer having a plurality of protruding electrodes formed on each of a plurality of devices, the protruding electrodes being referred to as bumps, a protective sheet having an adhesive layer (glue layer) of a thickness capable of embedding the protruding electrodes is affixed to the top surface of the wafer. The wafer is thereby prevented from being damaged with the protruding electrodes as a starting point when a contact pressure of the grinding wheel concentrates on the protruding electrodes.

SUMMARY OF THE INVENTION

However, when a protective sheet is peeled off the top surface of the wafer after the undersurface of the wafer is ground, a part of an adhesive layer remains on the protruding electrodes. There are thus problems of degrading quality and inducing a disconnection or the like.

It is accordingly an object of the present invention to provide a protective sheet disposing method that can prevent damage to a wafer due to protruding electrodes even when the plurality of protruding electrodes are formed on the top surface of a device, and does not cause the adhesive layer to remain on the protruding electrodes even when the protective sheet is peeled off the top surface of the wafer.

In accordance with an aspect of the present invention, there is provided a protective sheet disposing method of disposing a protective sheet on a top surface of a wafer in which a device region and a peripheral surplus region are formed, a plurality of devices being formed on the device region, and the peripheral surplus region surrounding the device region, the protective sheet disposing method including: a first protective sheet preparing step of preparing a first protective sheet having a non-adhesive portion corresponding to the device region and an adhesive portion having an adhesive layer laid on a periphery of the non-adhesive portion; a protective sheet affixing step of positioning the wafer in an opening portion of a frame having the opening portion for housing the wafer, positioning the non-adhesive portion of the first protective sheet onto the device region of the wafer, positioning the adhesive portion onto the peripheral surplus region and the frame, and affixing the first protective sheet to the peripheral surplus region and the frame; a cassette housing step of housing the wafer disposed in the frame via the first protective sheet into a cassette; a first table placing step of carrying out the wafer disposed in the frame via the first protective sheet from the cassette, and placing the wafer disposed in the frame via the first protective sheet onto a first table; a laying step of laying a second protective sheet having no adhesive layer onto a second table; a liquid resin dropping step of supporting the frame and carrying out the wafer from the first table, making the first protective sheet face the second protective sheet, and dropping a liquid resin onto a region of the second protective sheet, the region corresponding to a center of the wafer; an integrating step of spreading the liquid resin over an entire surface corresponding to the wafer by the second protective sheet and the first protective sheet by pressing the wafer against the liquid resin via the first protective sheet, and affixing the first protective sheet to the second protective sheet and integrating the first protective sheet and the second protective sheet with each other; and a cutting step of cutting the first protective sheet and the second protective sheet along an outer circumference of the wafer.

Preferably, the protective sheet disposing method further includes a center coordinate extracting step of detecting the outer circumference of the wafer placed on the first table and extracting center coordinates of the wafer, and in the cutting step, the first protective sheet and the second protective sheet are cut along the outer circumference of the wafer on a basis of the center coordinates of the wafer. Preferably, in the liquid resin dropping step, a liquid resin is laid also onto a region of the first protective sheet, the region corresponding to the center of the wafer. Preferably, in the integrating step, the second table is formed by a transparent body, and the liquid resin is cured by irradiating the liquid resin with ultraviolet light via the second table and the second protective sheet. Preferably, after the cutting step, the wafer on which the first protective sheet and the second protective sheet are disposed is housed into a cassette for housing the wafer.

According to another mode of the present invention, there is provided a protective sheet disposing method of disposing a protective sheet on a top surface of a wafer in which a device region and a peripheral surplus region are formed, a plurality of devices being formed on the device region, and the peripheral surplus region surrounding the device region, the protective sheet disposing method including: a preparing step of preparing the wafer disposed in a frame via a first protective sheet by positioning the wafer in an opening portion of the frame having the opening portion for housing the wafer, positioning a non-adhesive portion of the first protective sheet onto the device region of the wafer, the first protective sheet having the non-adhesive portion corresponding to the device region and an adhesive portion including an adhesive layer laid on a periphery of the non-adhesive portion, positioning the adhesive portion onto the peripheral surplus region and the frame, and affixing the first protective sheet to the peripheral surplus region and the frame; a first table placing step of placing the wafer disposed in the frame via the first protective sheet onto a first table; a laying step of laying a second protective sheet having no adhesive layer onto a second table; a liquid resin dropping step of supporting the frame and carrying out the wafer from the first table, making the first protective sheet face the second protective sheet, and dropping a liquid resin onto a region of the second protective sheet, the region corresponding to a center of the wafer; an integrating step of spreading the liquid resin over an entire surface corresponding to the wafer by the second protective sheet and the first protective sheet by pressing the wafer against the liquid resin via the first protective sheet, and affixing the first protective sheet to the second protective sheet and integrating the first protective sheet and the second protective sheet with each other; and a cutting step of cutting the first protective sheet and the second protective sheet along an outer circumference of the wafer.

According to the present invention, even when a plurality of protruding electrodes are formed on the top surface of a device, the protruding electrodes are embedded by the first protective sheet, the liquid resin, and the second protective sheet. It is therefore possible to prevent damage to the wafer due to the protruding electrodes when a grinding apparatus grinds the undersurface of the wafer. In addition, according to the present invention, the non-adhesive portion having no adhesive layer laid therein comes into contact with the device region, and the adhesive portion is affixed to the peripheral surplus region in which no devices are formed. Thus, the adhesive layer does not remain on the protruding electrodes even when the first protective sheet is peeled off the top surface of the wafer, so that problems of degrading the quality of the devices and inducing a disconnection or the like can be solved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of a protective sheet disposing method according to the present invention will hereinafter be described with reference to the drawings.

Figure 1A:
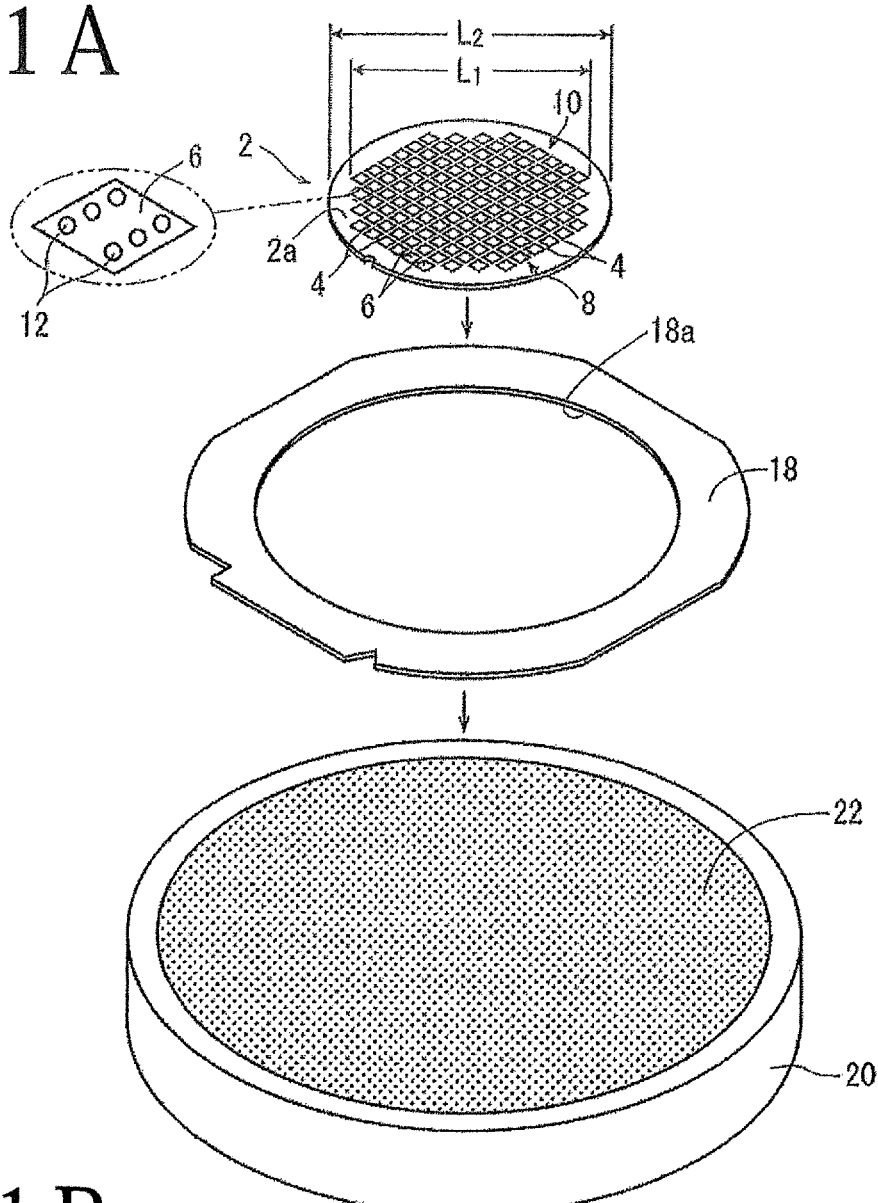
FIG. 1A is a perspective view of a wafer, a frame, and a vacuum table.

FIG. 1A illustrates a wafer 2 on which a protective sheet is to be disposed by a protective sheet disposing method according to the present invention. A top surface 2a of the wafer 2 in the shape of a disk is demarcated into a plurality of rectangular regions by planned dividing lines 4 in the form of a lattice. A device 6 such as an IC, an LSI, or the like is formed in each of the plurality of rectangular regions. As illustrated in FIG. 1A, the top surface 2a of the wafer 2 includes a device region 8 in which a plurality of devices 6 are formed and a peripheral surplus region 10 that surrounds the device region 8 and in which no devices 6 are formed. In addition, as illustrated on a part of the devices 6 on an enlarged scale in FIG. 1A, a plurality of protruding electrodes 12 referred to as bumps are formed on the top surface of the devices 6. Incidentally, each protruding electrode 12 is connected to an electrode on a printed board when the divided device 6 is mounted on the printed board.

Figure 2:
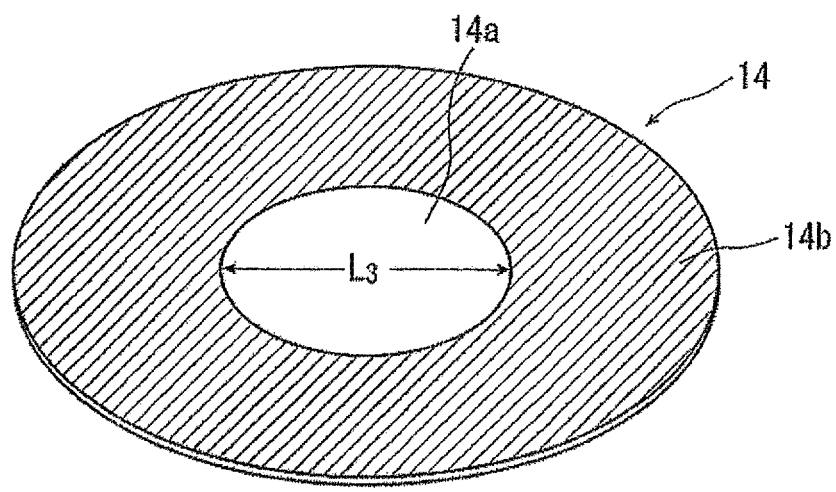
FIG. 2 is a perspective view of a first protective sheet.

In the embodiment illustrated in the figures, a first protective sheet preparing step is performed first which prepares a first protective sheet having a non-adhesive portion corresponding to the device region 8 and an adhesive portion including an adhesive layer laid on the periphery of the non-adhesive portion. A circular sheet indicated by reference numeral 14 in FIG. 2 is an example of the first protective sheet prepared in the first protective sheet preparing step. The circular sheet has a circular non-adhesive portion 14a corresponding to the device region 8 and an annular adhesive portion 14b (portion indicated by hatching) including an adhesive layer laid on the periphery of the non-adhesive portion 14a. Making description with reference to FIG. 1A and FIG. 2, a diameter $L_3$ of the non-adhesive portion 14a having no adhesive layer laid therein is larger than a diameter $L_1$ of the device region 8, and is smaller than a diameter $L_2$ of the wafer 2 ($L_2 > L_3 > L_1$).

Figure 1B:
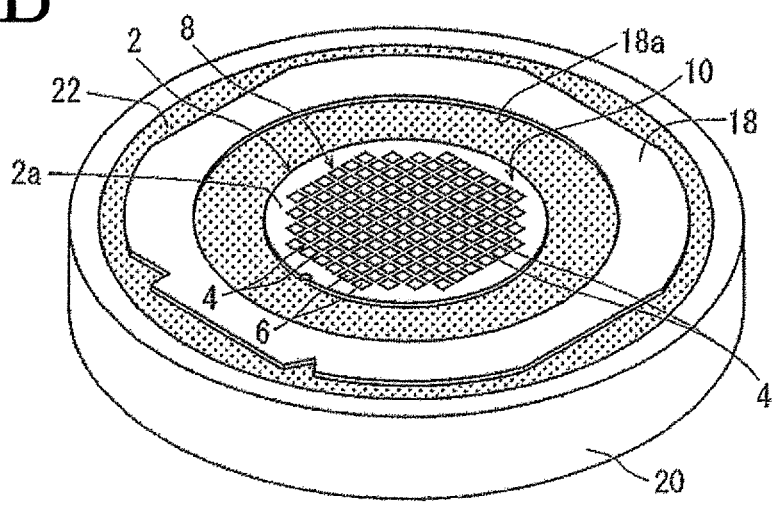
FIG. 1B is a perspective view illustrating a state in which the wafer and the frame are placed on the vacuum table.

After the first protective sheet preparing step is performed, a protective sheet affixing step is performed which positions the wafer 2 in an opening portion of a frame having the opening portion for housing the wafer 2, positions the non-adhesive portion 14a of the first protective sheet 14 onto the device region 8 of the wafer 2, and positions the adhesive portion 14b of the first protective sheet 14 onto the peripheral surplus region 10 and the frame, and affixes the first protective sheet 14 to the peripheral surplus region 10 and the frame. In the protective sheet affixing step, first, as illustrated in FIG. 1A and FIG. 1B, the wafer 2 is positioned in an opening portion 18a of the annular frame 18 having the opening portion 18a for housing the wafer 2 in a state in which the top surface 2a is oriented upward, and the wafer 2 and the frame 18 are placed onto a circular vacuum table 20. An upper end part of the vacuum table 20 is provided with a porous circular vacuum part 22 connected to suction means (not illustrated).

Figure 3:
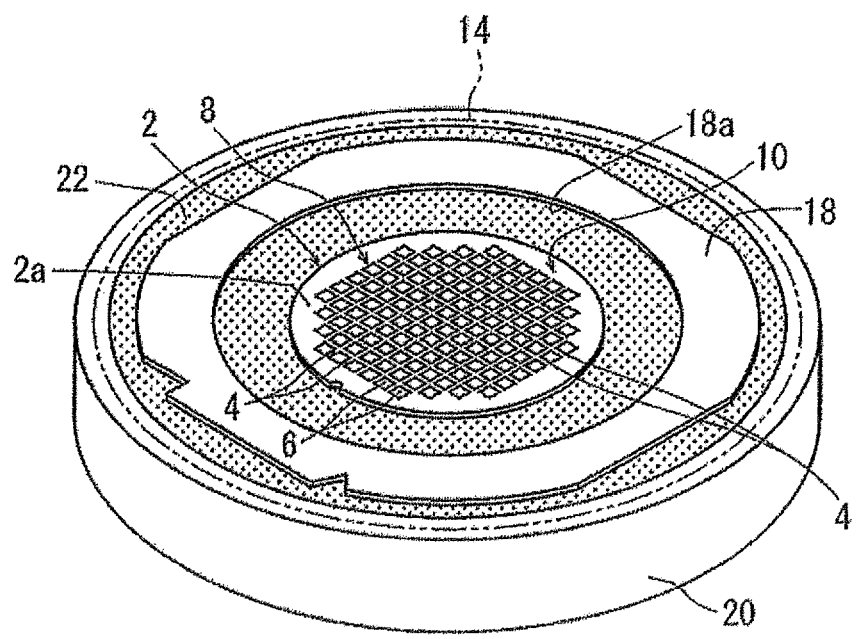
FIG. 3 is a perspective view illustrating a state in which the first protective sheet is affixed to a peripheral surplus region and the frame.

Next, as illustrated in FIG. 3, the non-adhesive portion 14a is positioned onto the device region 8, the adhesive portion 14b is positioned onto the peripheral surplus region 10 and the frame 18, and the first protective sheet 14 is affixed to the peripheral surplus region 10 and the frame 18. Incidentally, in FIG. 3, for convenience, the first protective sheet 14 is indicated by a chain double-dashed line so that the wafer 2 and an inner circumferential edge portion of the frame 18 that are located below the first protective sheet 14 are visible. As described above, the diameter $L_3$ of the non-adhesive portion 14a is larger than the diameter $L_1$ of the device region 8, and is smaller than the diameter $L_2$ of the wafer 2 ($L_2 > L_3 > L_1$). Thus, when the first protective sheet 14 is affixed to the wafer 2 and the frame 18, the non-adhesive portion 14a having no adhesive layer laid therein comes into contact with the device region 8, and the adhesive portion 14b is affixed to the peripheral surplus region 10 in which the devices 6 are not formed. The adhesive layer therefore does not come into contact with the protruding electrodes 12 of the devices 6.

Figure 4:
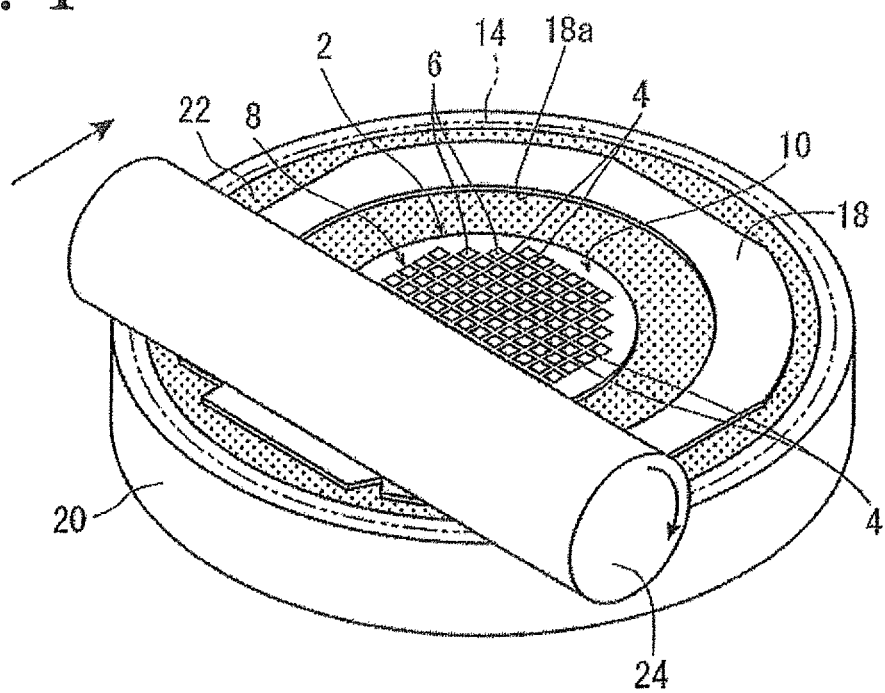
FIG. 4 is a perspective view illustrating a state in which the first protective sheet is pressed by a roller.
Figure 5:
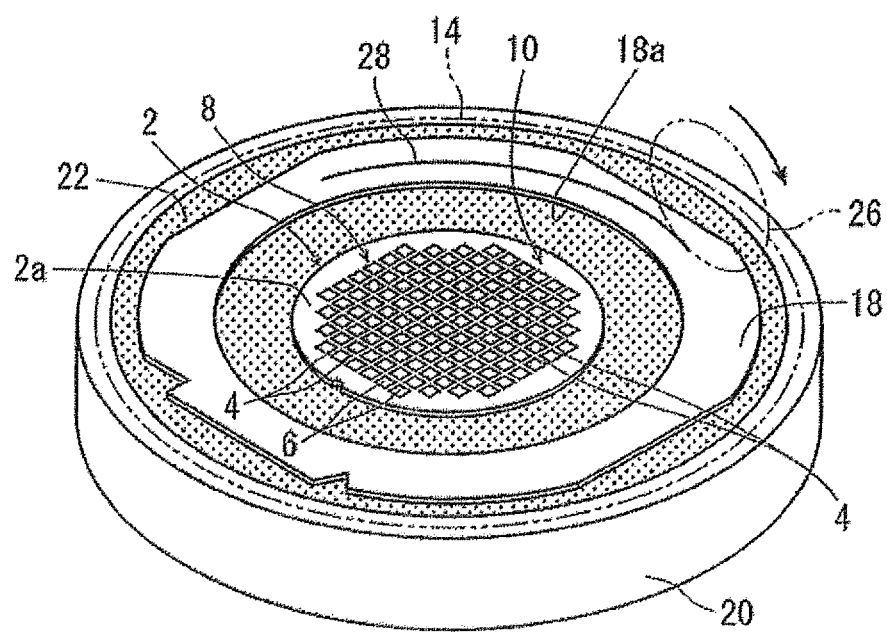
FIG. 5 is a perspective view illustrating a state in which the first protective sheet is being cut.

Next, the suction means generates a suction force in a top surface of the vacuum part 22, and the vacuum table 20 sucks and holds the wafer 2, the frame 18, and the first protective sheet 14. As illustrated in FIG. 3, the diameter of the first protective sheet 14 (outside diameter of the adhesive portion 14b) is larger than the diameter of the vacuum part 22. Thus, when the suction means is actuated, a predetermined suction force can be generated on the top surface of the vacuum part 22. Next, as illustrated in FIG. 4, the wafer 2 and the first protective sheet 14 are brought into close contact with each other by pressing the first protective sheet 14 by a roller 24. Incidentally, when the first protective sheet 14 is pressed by the roller 24, the first protective sheet 14 may be softened by heating to improve a degree of close contact between the wafer 2 and the first protective sheet 14. Next, as illustrated in FIG. 5, the first protective sheet 14 located on the frame 18 is cut by an appropriate cutting tool 26 such as a cutter having a rotatable circular blade or the like to remove an annular outer part of the first protective sheet 14, the annular outer part being located on the outside of a circumference-shaped cutting line 28. The protective sheet affixing step is thus performed.

Figure 6:
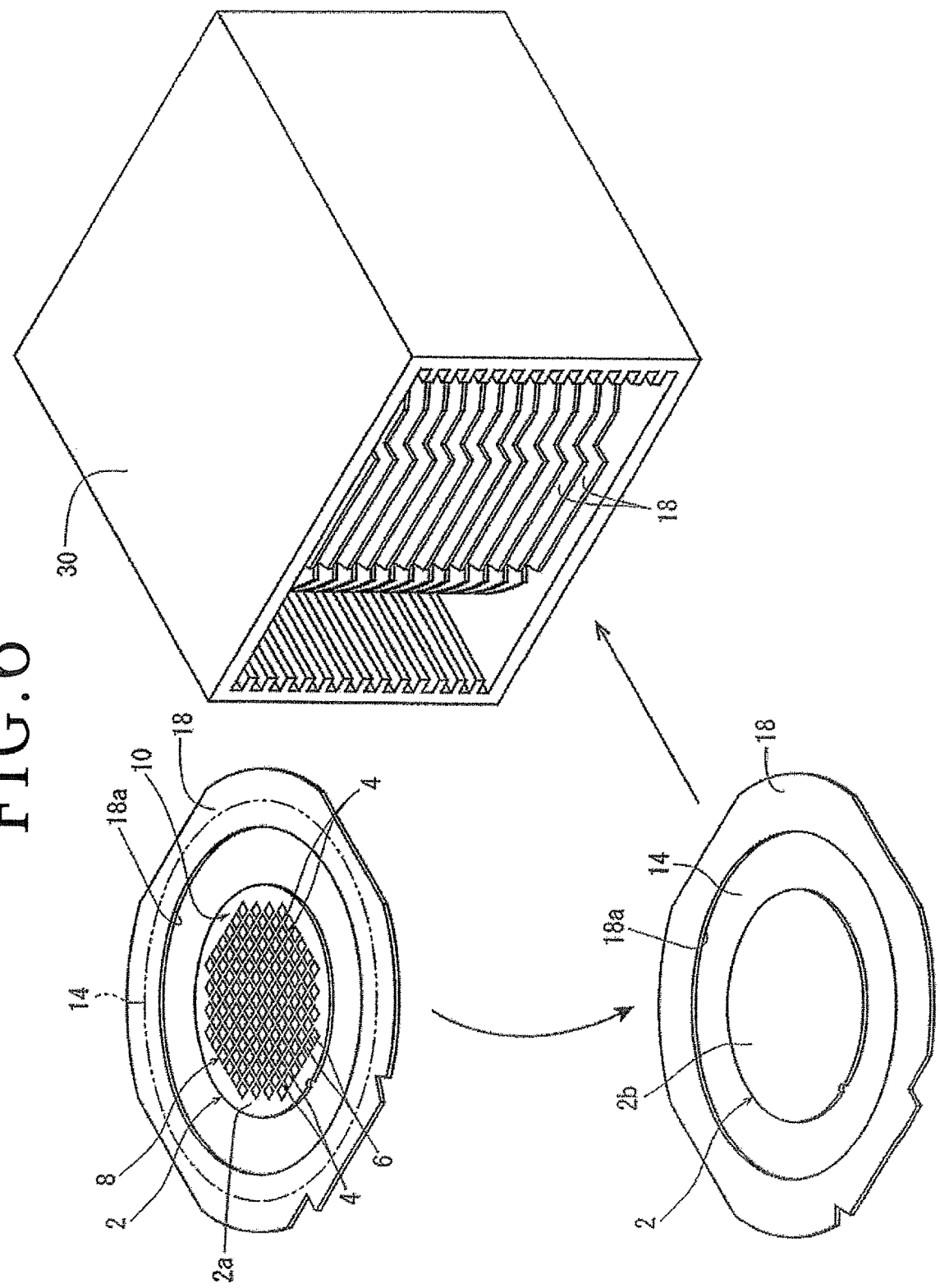
FIG. 6 is a perspective view illustrating a state in which a cassette housing step is being performed.

After the protective sheet affixing step is performed, as illustrated in FIG. 6, a cassette housing step is performed which houses, into a cassette 30, the wafer 2 disposed in the frame 18 via the first protective sheet 14. The cassette housing step houses a plurality of wafers 2 into the cassette 30 with the undersurfaces 2b of the wafers 2 oriented upward (that is, with the first protective sheets 14 oriented downward). Then, the cassette 30 housing the wafers 2 is conveyed to a place where a subsequent step is performed.

Figure 7:
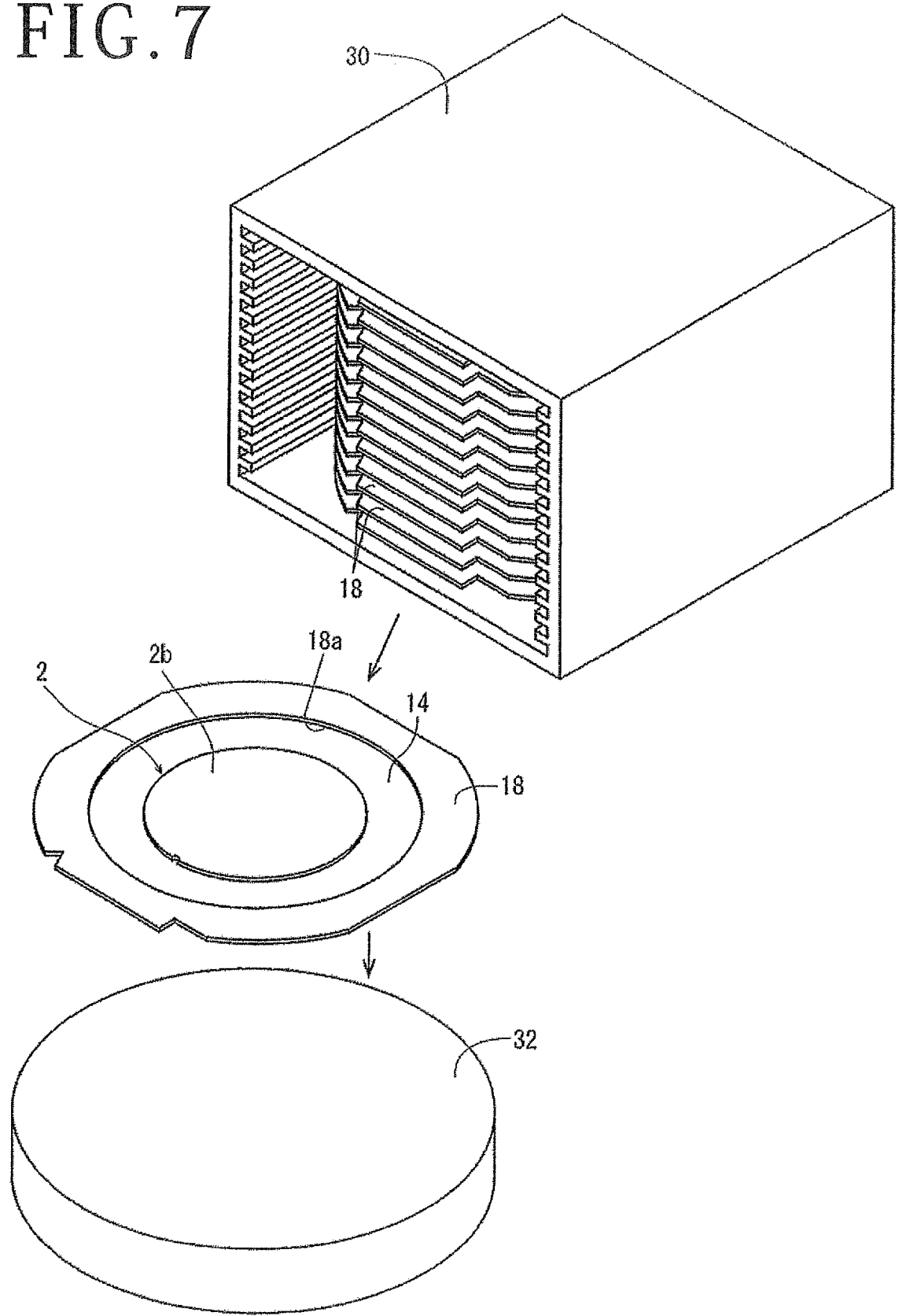
FIG. 7 is a perspective view illustrating a state in which a first table placing step is being performed.

After the cassette housing step is performed, as illustrated in FIG. 7, a first table placing step is performed which carries out the wafer 2 disposed in the frame 18 via the first protective sheet 14 from the cassette 30, and places the wafer 2 onto a first table 32. The first table 32 in a circular shape in the embodiment illustrated in the figures is configured to be rotated on the basis of a control signal from control means (not illustrated). In addition, a storage unit of the control means stores the size of the frame 18, the center coordinates of the first table 32, and the like in advance. Then, in the first table placing step, the wafer 2 is placed onto the first table 32 in a state in which the undersurface 2b is oriented upward such that a positional relation between the first table 32 and the frame 18 is a predetermined positional relation.

Figure 8:
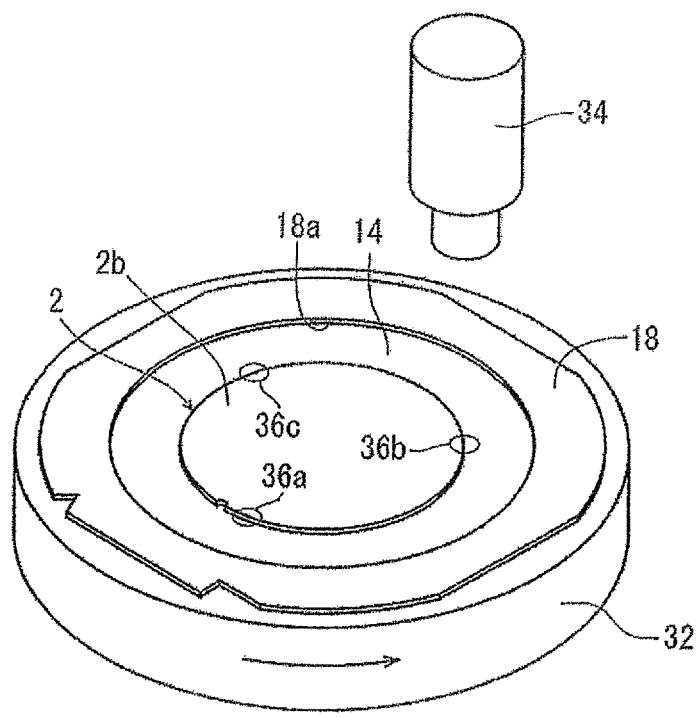
FIG. 8 is a perspective view illustrating a state in which a center coordinate extracting step is being performed.

In the embodiment illustrated in the figures, after the first table placing step is performed, a center coordinate extracting step is performed which extracts the center coordinates of the wafer 2 by detecting the outer circumference of the wafer 2 placed on the first table 32. As illustrated in FIG. 8, imaging means 34 positioned above the wafer 2 images three points on the outer circumference of the wafer 2 (three points indicated by reference symbols 36a, 36b, and 36c in FIG. 8, for example) while the first table 32 is rotated intermittently. The imaging means 34 is electrically connected to the above-described control means. An image imaged by the imaging means 34 is input to the above-described control means. Then, the above-described control means obtains the coordinate positions of the three points on the basis of the image imaged by the imaging means 34, and next calculates the center coordinates of the wafer 2 on the basis of the coordinates of the three points. As described above, the size of the frame 18 and the center coordinates of the first table 32 are known, and the positional relation between the first table 32 and the frame 18 is a predetermined positional relation. Thus, the control means can also calculate a relation between the central position of the frame 18 and the central position of the wafer 2 on the basis of the calculated center coordinates of the wafer 2. Incidentally, the center coordinate extracting step may be performed immediately before a cutting step to be described later.

Figure 9:
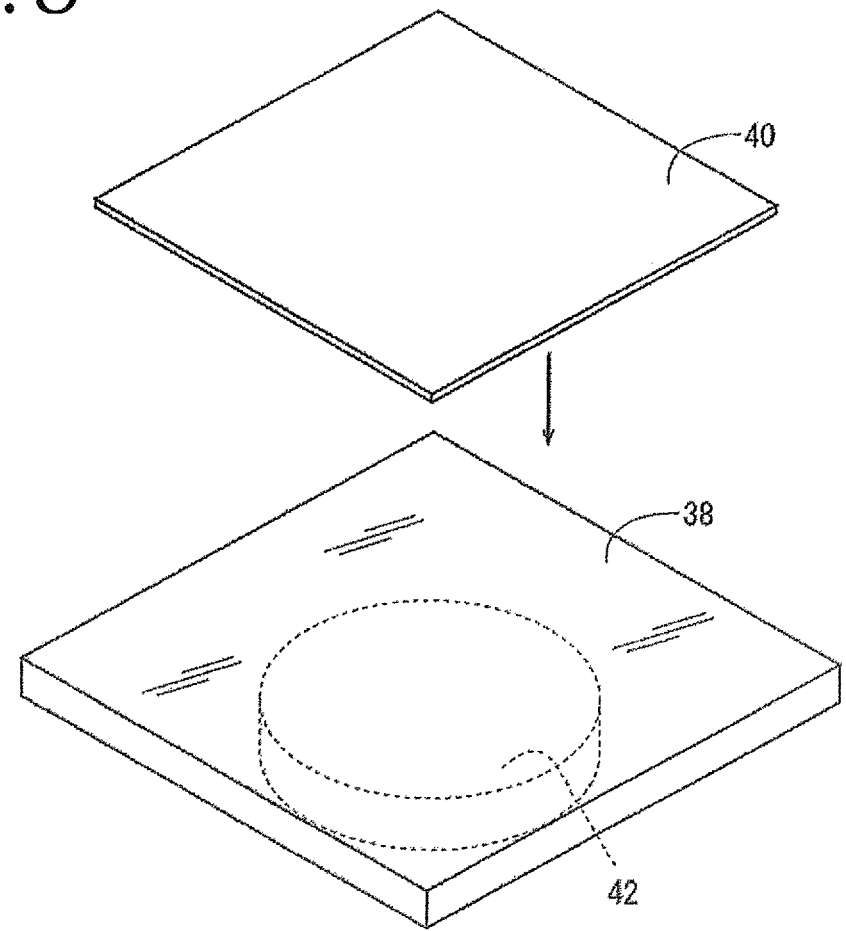
FIG. 9 is a perspective view illustrating a state in which a laying step is being performed.

Before or after the first table placing step or the center coordinate extracting step or in parallel with the first table placing step or the center coordinate extracting step, as illustrated in FIG. 9, a laying step is performed which lays a second protective sheet 40 having no adhesive layer onto a second table 38. In the embodiment illustrated in the figures, the second table 38 is formed by a transparent body (for example, glass), and an ultraviolet light irradiating apparatus 42 is disposed below the second table 38.

Figure 10:
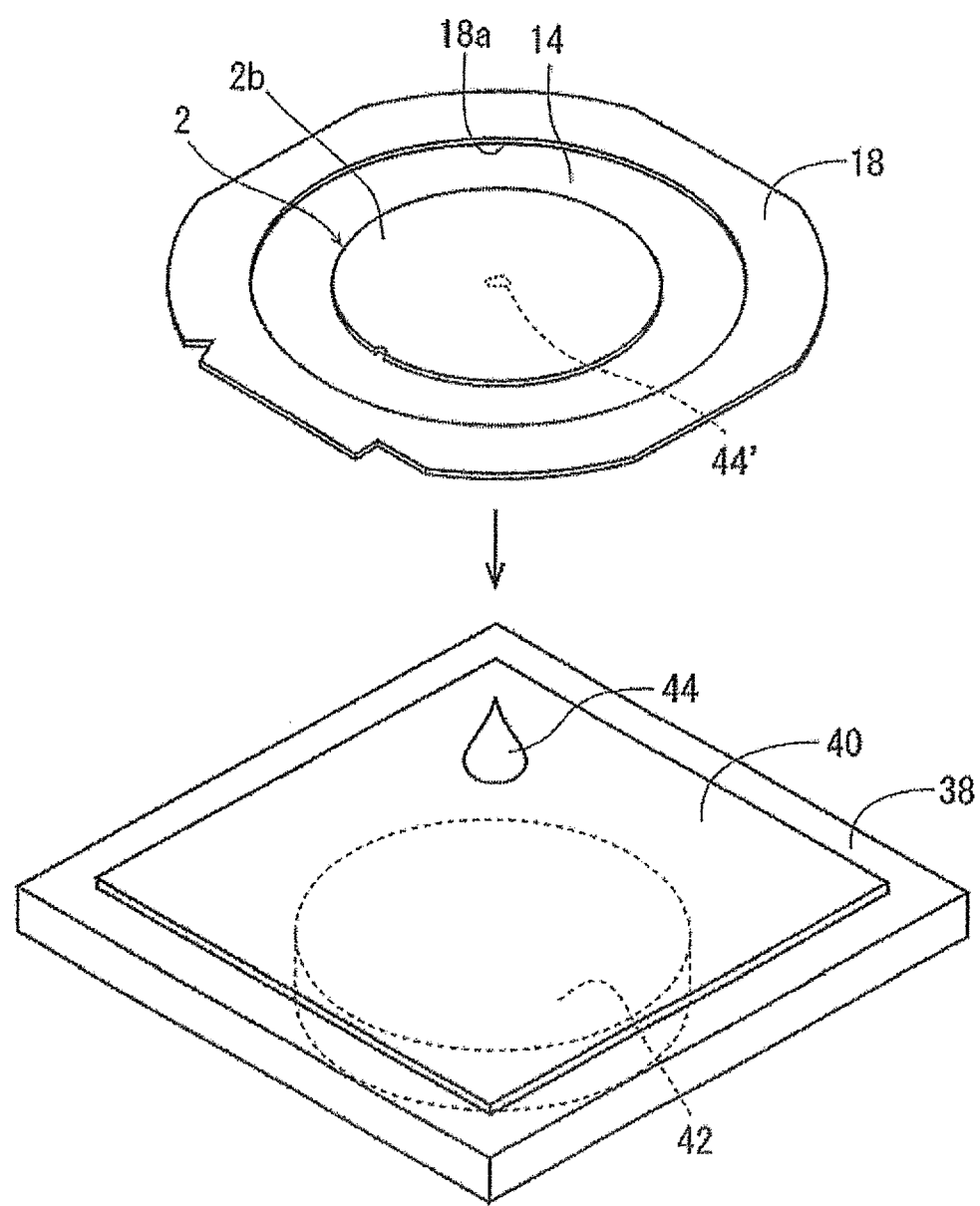
FIG. 10 is a perspective view illustrating a state in which a liquid resin dropping step is being performed.

After the laying step is performed, as illustrated in FIG. 10, a liquid resin dropping step is performed which supports the frame 18 and carries out the wafer 2 from the first table 32, makes the first protective sheet 14 face the second protective sheet 40, and drops a liquid resin 44 (for example, an ultraviolet curing resin) onto a region of the second protective sheet 40, the region corresponding to the center of the wafer 2. In the liquid resin dropping step, it is preferable to lay a liquid resin 44' (same resin as the resin dropped onto the second protective sheet 40) also on a region of the first protective sheet 14, the region corresponding to the center of the wafer 2. Consequently, when the liquid resin 44 is spread in an integrating step to be described below, the liquid resin 44' on the first protective sheet 14 and the liquid resin 44 on the second protective sheet 40 are bonded to each other, so that air bubbles can be prevented from occurring within the liquid resin 44.

Figure 11A:
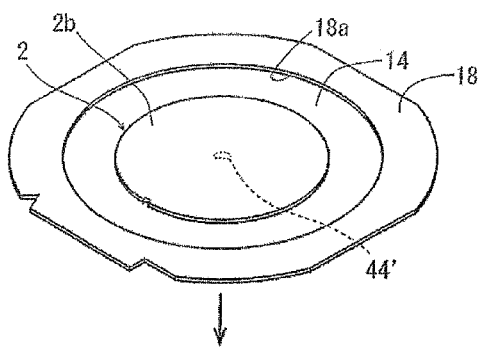
FIG. 11A is a perspective view illustrating a state in which the first protective sheet faces a second protective sheet.
Figure 11A:
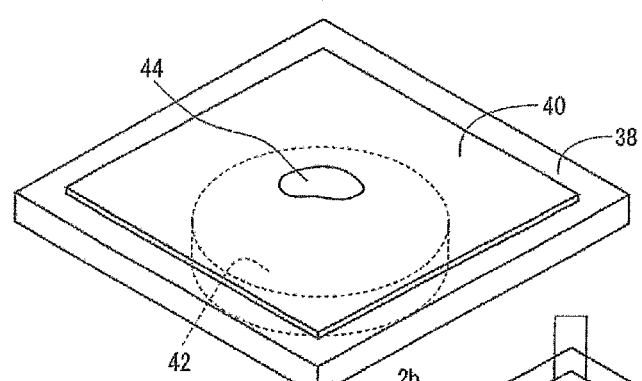
Figure 11B:
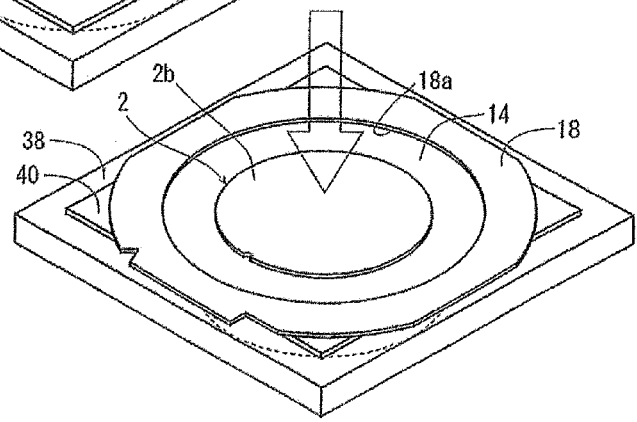
FIG. 11B is a perspective view illustrating a state in which an integrating step is being performed.
Figure 12:
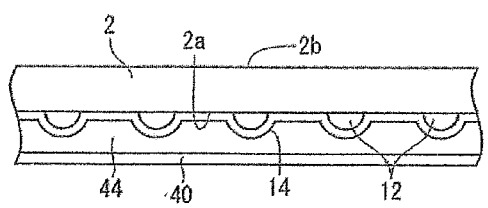
FIG. 12 is a sectional view illustrating a state in which the wafer, the first protective sheet, the second protective sheet, and a liquid resin are integrated with each other.

After the liquid resin dropping step is performed, as illustrated in FIG. 11A and FIG. 11B, an integrating step is performed which spreads the liquid resin 44 over an entire surface corresponding to the wafer 2 by the second protective sheet 40 and the first protective sheet 14 by pressing the wafer 2 against the liquid resin 44 via the first protective sheet 14, and affixes the first protective sheet 14 to the second protective sheet 40 and integrates the first protective sheet 14 and the second protective sheet 40 with each other. When the wafer 2 is pressed in the integrating step, the undersurface 2b of the wafer 2 and the second protective sheet 40 are made parallel with each other by pressing the whole of the undersurface 2b of the wafer 2 at the same time by a press apparatus (not illustrated) having a pressing surface with an area larger than the area of the wafer 2 or the like. In addition, in the case where an ultraviolet curing resin is used as the liquid resin 44, ultraviolet light is applied from the ultraviolet light irradiating apparatus 42 via the second table 38 and the second protective sheet 40 to cure the liquid resin 44. The wafer 2 disposed in the frame 18 via the first protective sheet 14 and the second protective sheet 40 are thereby integrated with each other via the liquid resin 44. When the first protective sheet 14, the liquid resin 44, and the second protective sheet 40 are arranged in a layered manner on the top surface 2a of the wafer 2, the protruding electrodes 12 are embedded by the first protective sheet 14, the liquid resin 44, and the second protective sheet 40, as illustrated in FIG. 12.

Figure 13:
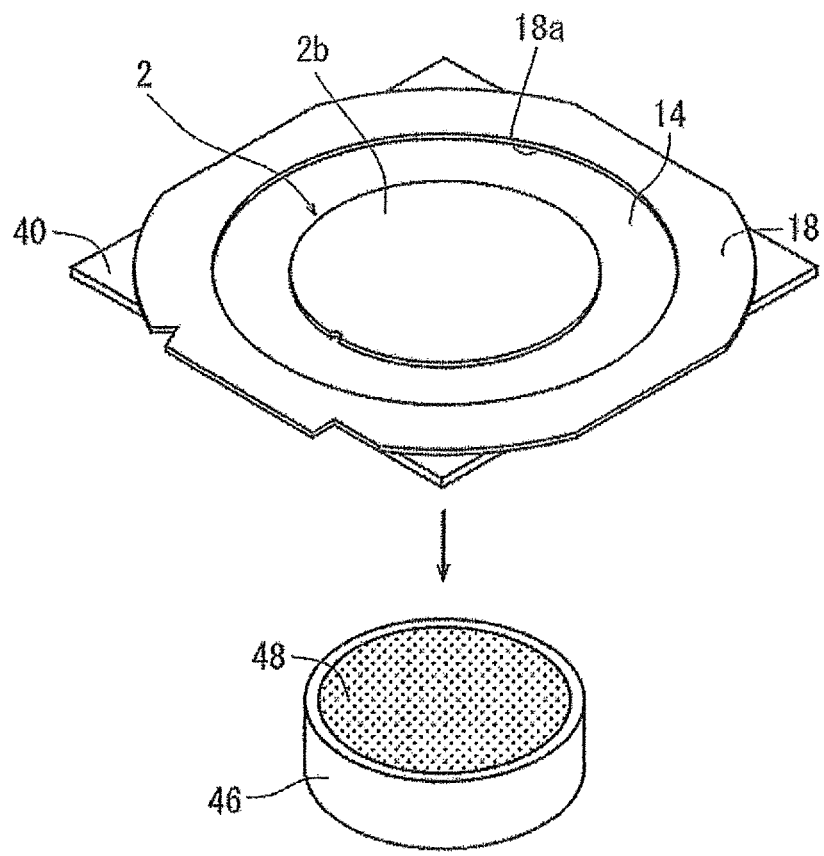
FIG. 13 is a perspective view illustrating a state in which a cutting step is being performed.
Figure 13:
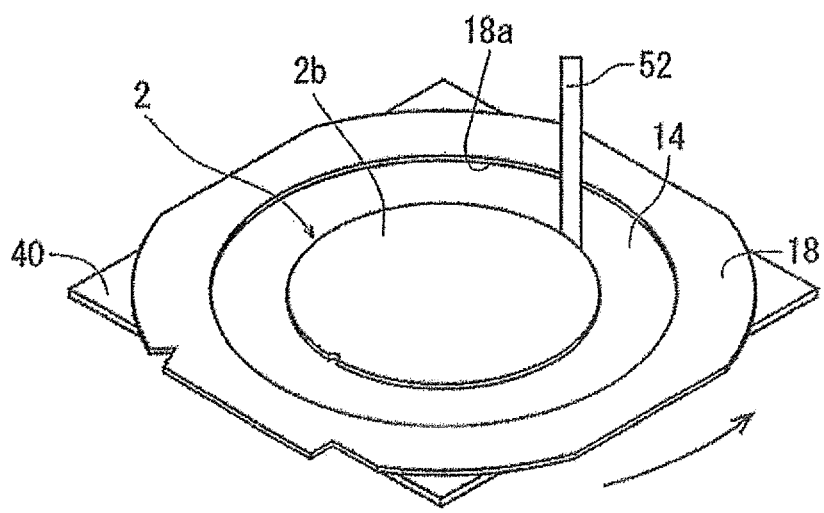
Figure 14:
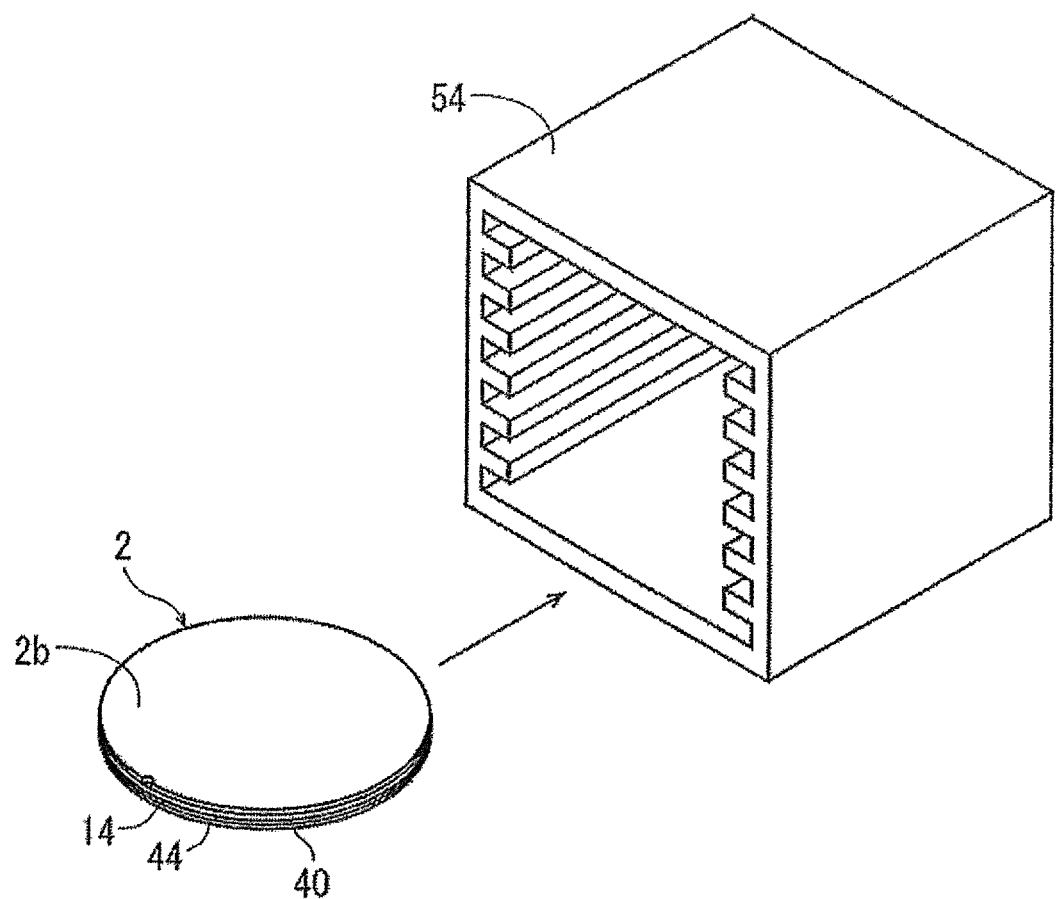
FIG. 14 is a perspective view illustrating a state in which the wafer on which the protective sheets are disposed is being housed into a cassette.

After the integrating step is performed, a cutting step is performed which cuts the first protective sheet 14 and the second protective sheet 40 along the outer circumference of the wafer 2. The cutting step can be performed with the wafer 2 placed on a chuck table 46 illustrated in FIG. 13, for example. The diameter of the chuck table 46 is smaller than the diameter $L_2$ of the wafer 2. An upper end part of the chuck table 46 is provided with a porous circular suction chuck 48 connected to the suction means (not illustrated). In addition, the chuck table 46 is configured to be rotatable.

In the cutting step, first, the center of rotation of the chuck table 46 and the center of the wafer 2 are aligned with each other, and in a state in which the undersurface 2b of the wafer 2 is oriented upward, the wafer 2 is placed onto the chuck table 46 while the frame 18 is supported. In the embodiment illustrated in the figures, the storage unit of the above-described control means also stores the center coordinates of the chuck table 46 in advance. When the wafer 2 is placed onto the chuck table 46 while the frame 18 is supported, the center of rotation of the chuck table 46 and the center of the wafer 2 are aligned with each other on the basis of the relation between the central position of the wafer 2 and the central position of the frame 18, the relation being calculated in the center coordinate extracting step. Next, a cutting edge 52 of a cutting tool is positioned above the outer circumference of the wafer 2. Next, the first protective sheet 14 and the second protective sheet 40 are cut along the outer circumference of the wafer 2 by rotating the chuck table 46 and lowering the cutting edge 52 positioned above the outer circumference of the wafer 2. Thus, in the embodiment illustrated in the figures, the first protective sheet 14 and the second protective sheet 40 are cut along the outer circumference of the wafer 2 on the basis of the center coordinates of the wafer 2, the center coordinates being extracted in the center coordinate extracting step. Then, after the cutting step is performed, the wafer 2 on which the first protective sheet 14 and the second protective sheet 40 are disposed is housed into a cassette 54 that can house a plurality of wafers 2, and the cassette 54 is conveyed to a grinding apparatus that grinds the undersurface 2b of the wafer 2.

As described above, in the embodiment illustrated in the figures, even when a plurality of protruding electrodes 12 are formed on the top surfaces of the devices 6, the protruding electrodes 12 are embedded by the first protective sheet 14, the liquid resin 44, and the second protective sheet 40. It is therefore possible to prevent damage to the wafer 2 due to the protruding electrodes 12 when the grinding apparatus grinds the undersurface 2b of the wafer 2. In addition, in the embodiment illustrated in the figures, the non-adhesive portion 14a having no adhesive layer laid therein comes into contact with the device region 8, and the adhesive portion 14b is affixed to the peripheral surplus region 10 in which no devices 6 are formed. Thus, the adhesive layer does not remain on the protruding electrodes 12 even when the first protective sheet 14 is peeled off the top surface 2a of the wafer 2, so that problems of degrading the quality of the devices 6 and causing a disconnection or the like can be solved.

Incidentally, in the embodiment illustrated in the figures, description has been made of an example including the first protective sheet preparing step, the protective sheet affixing step, and the cassette housing step. However, the protective sheet disposing method according to the present invention may not include these steps. That is, when the protective sheet disposing method according to the present invention is performed, the protective sheet disposing method according to the present invention may first be started with a preparing step of preparing a wafer 2 disposed in a frame 18 via a first protective sheet 14 (see FIG. 6). Making detailed description of the wafer 2 prepared in the preparing step, the wafer 2 disposed in the frame 18 via the first protective sheet 14 is prepared by positioning the wafer 2 in an opening portion 18a of the frame 18 having the opening portion 18a for housing the wafer 2, positioning a non-adhesive portion 14a of the first protective sheet 14 onto a device region 8 of the wafer 2, the first protective sheet 14 having the non-adhesive portion 14a corresponding to the device region 8 of the wafer 2 and an adhesive portion 14b including an adhesive layer laid on the periphery of the non-adhesive portion 14a, positioning the adhesive portion 14b onto a peripheral surplus region 10 of the wafer 2 and the frame 18, and affixing the first protective sheet 14 to the peripheral surplus region 10 and the frame 18. Then, after the preparing step is performed, the first table placing step is performed which places the wafer 2 disposed in the frame 18 via the first protective sheet 14 onto a first table 32. After the first table placing step is performed, at least the laying step, the liquid resin dropping step, the integrating step, and the cutting step are performed as in the foregoing embodiment.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective sheet disposing method of disposing a protective sheet on a top surface of a wafer in which a device region and a peripheral surplus region are formed, a plurality of devices being formed on the device region, and the peripheral surplus region surrounding the device region, the protective sheet disposing method comprising:

a first protective sheet preparing step of preparing a first protective sheet having a non-adhesive portion corresponding to the device region and an adhesive portion having an adhesive layer laid on a periphery of the non-adhesive portion;

a protective sheet affixing step of positioning the wafer in an opening portion of a frame having the opening portion for housing the wafer, and positioning the first protective sheet, in a state in which the frame is not yet attached thereto, such that the non-adhesive portion of the first protective sheet is positioned one onto the device region of the wafer and the adhesive portion is positioned onto both the peripheral surplus region of the wafer and the frame;

a cassette housing step of housing the wafer disposed in the frame via the first protective sheet into a cassette;

a first table placing step of carrying out the wafer disposed in the frame via the first protective sheet from the cassette, and placing the wafer disposed in the frame via the first protective sheet onto a first table;

a laying step of laying a second protective sheet having no adhesive layer onto a second table;

a liquid resin dropping step of supporting the frame and carrying out the wafer from the first table, making the first protective sheet face the second protective sheet, and dropping a liquid resin onto a region of the second protective sheet, the region corresponding to a center of the wafer after the first table placing step and the laying step;

an integrating step of spreading the liquid resin over an entire surface corresponding to the wafer by the second protective sheet and the first protective sheet by pressing the wafer against the liquid resin via the first protective sheet, and affixing the first protective sheet to the second protective sheet and integrating the first protective sheet and the second protective sheet with each other after the liquid resin dropping step; and a cutting step of cutting the first protective sheet and the second protective sheet along an outer circumference of the wafer after the integrating step, wherein the affixing of the protective sheet affixing step includes a step of pressing the first protective sheet against the peripheral surplus region of the wafer and against the frame, and further wherein during at least a portion of the pressing step the first protective sheet is simultaneously pressed against both at least a portion of the peripheral surplus region of the wafer and at least a portion of the frame.

2. The protective sheet disposing method according to claim 1, further comprising:

a center coordinate extracting step of detecting the outer circumference of the wafer placed on the first table and extracting center coordinates of the wafer, wherein, in the cutting step, the first protective sheet and the second protective sheet are cut along the outer circumference of the wafer on a basis of the center coordinates of the wafer.

3. The protective sheet disposing method according to claim 1, wherein, in the liquid resin dropping step, further liquid resin is laid also onto a region of the first protective sheet, the region corresponding to the center of the wafer.

4. The protective sheet disposing method according to claim 1, wherein, in the integrating step, the second table is formed by a transparent body, and the liquid resin is cured by irradiating the liquid resin with ultraviolet light via the second table and the second protective sheet.

5. The protective sheet disposing method according to claim 1, wherein, after the cutting step, the wafer on which the first protective sheet and the second protective sheet are disposed is housed into a cassette for housing the wafer.

6. A protective sheet disposing method of disposing a protective sheet on a top surface of a wafer in which a device region and a peripheral surplus region are formed, a plurality of devices being formed on the device region, and the peripheral surplus region surrounding the device region, the protective sheet disposing method comprising:

a preparing step of preparing the wafer disposed in a frame via a first protective sheet by positioning the wafer in an opening portion of the frame having the opening portion for housing the wafer, positioning the first protective sheet, in a state in which the frame is not yet attached thereto, by positioning a non-adhesive portion of the first protective sheet onto the device region of the wafer, the first protective sheet having the non-adhesive portion corresponding to the device region and an adhesive portion including an adhesive layer laid on a periphery of the non-adhesive portion, while also positioning the adhesive portion onto both the peripheral surplus region of the wafer and the frame, and then affixing the first protective sheet to the peripheral surplus region and the frame;

a first table placing step of placing the wafer disposed in the frame via the first protective sheet onto a first table;

a laying step of laying a second protective sheet having no adhesive layer onto a second table;

a liquid resin dropping step of supporting the frame and carrying out the wafer from the first table, making the first protective sheet face the second protective sheet, and dropping a liquid resin onto a region of the second protective sheet, the region corresponding to a center of the wafer after the first table placing step and the laying step;

an integrating step of spreading the liquid resin over an entire surface corresponding to the wafer by the second protective sheet and the first protective sheet by pressing the wafer against the liquid resin via the first protective sheet, and affixing the first protective sheet to the second protective sheet and integrating the first protective sheet and the second protective sheet with each other after the liquid resin dropping step; and a cutting step of cutting the first protective sheet and the second protective sheet along an outer circumference of the wafer after the integrating step, wherein the affixing of the first protective sheet to the peripheral surplus region and the frame includes a step of pressing the first protective sheet against the peripheral surplus region of the wafer and against the frame, and further wherein during at least a portion of the pressing step the first protective sheet is simultaneously pressed against both at least a portion of the peripheral surplus region of the wafer and at least a portion of the frame.

7. A protective sheet disposing method of disposing a protective sheet on a top surface of a wafer in which a device region and a peripheral surplus region are formed, a plurality of devices being formed on the device region, and the peripheral surplus region surrounding the device region, the protective sheet disposing method comprising:

a preparing step of preparing the wafer disposed in a frame via a first protective sheet by positioning the wafer in an opening portion of the frame having the opening portion for housing the wafer, positioning the first protective sheet, in a state in which the frame is not yet attached thereto, by positioning a non-adhesive portion of the first protective sheet onto the device region of the wafer, the first protective sheet having the non-adhesive portion corresponding to the device region and an adhesive portion including an adhesive layer laid on a periphery of the non-adhesive portion, while also positioning the adhesive portion onto both the peripheral surplus region of the wafer and the frame, and then affixing the first protective sheet to the peripheral surplus region and the frame;

a first table placing step of placing the wafer disposed in the frame via the first protective sheet onto a first table;

a laying step of laying a second protective sheet having no adhesive layer onto a second table;

a liquid resin dropping step of supporting the frame and carrying out the wafer from the first table, making the first protective sheet face the second protective sheet, and dropping a liquid resin onto a region of the second protective sheet, the region corresponding to a center of the wafer, and wherein further liquid resin is laid also onto a region of the first protective sheet, the region corresponding to the center of the wafer after the first table placing step and the laying step;

an integrating step of spreading the liquid resin and the further liquid resin over an entire surface corresponding to the wafer by the second protective sheet and the first protective sheet by pressing the wafer against the liquid resin and the further liquid resin via the first protective sheet, and affixing the first protective sheet to the second protective sheet and integrating the first protective sheet and the second protective sheet with each other after the liquid resin dropping step; and a cutting step of cutting the first protective sheet and the second protective sheet along an outer circumference of the wafer after the integrating step, wherein the affixing of the first protective sheet to the peripheral surplus region and the frame includes a step of pressing the first protective sheet against the peripheral surplus region of the wafer and against the frame, and further wherein during at least a portion of the pressing step the first protective sheet is simultaneously pressed against both at least a portion of the peripheral surplus region of the wafer and at least a portion of the frame.

8. The protective sheet disposing method according to claim 1, wherein the step of pressing comprises rolling a roller upon the first protective sheet.

9. The protective sheet disposing method according to claim 6, wherein the step of pressing comprises rolling a roller upon the first protective sheet.

10. The protective sheet disposing method according to claim 7, wherein the step of pressing comprises rolling a roller upon the first protective sheet.

* * * * *

UNITED STATES PATENT AND TRADEMARK OFFICE
CERTIFICATE OF CORRECTION

PATENT NO. : 11,298,928 B2
APPLICATION NO. : 16/375041
DATED : April 12, 2022
INVENTOR(S) : Takashi Mori et al.

It is certified that error appears in the above-identified patent and that said Letters Patent is hereby corrected as shown below:

In the Claims

Column 8, Line 58, delete "one".

Signed and Sealed this
Twelfth Day of July, 2022

Katherine Kelly Vidal
*Director of the United States Patent and Trademark Office*